(12) United States Patent  (10) Patent No.: US 9,240,387 B2
Chen et al.  (45) Date of Patent: Jan. 19, 2016

(54) WAFER-LEVEL CHIP SCALE PACKAGE WITH RE-WORKABLE UNDERFILL

(75) Inventors: Hsien-Wei Chen, Sinying (TW); Tsung-Ding Wang, Tainan (TW); Chien-Hsiun Lee, Chu-Tung Town (TW); Hao-Yi Tsai, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/272,009

(22) Filed: Oct. 12, 2011

(65) Prior Publication Data

US 2013/0093084 A1    Apr. 18, 2013

(51) Int. Cl.
*H01L 23/48* (2006.01)
*H01L 23/00* (2006.01)
*H01L 21/56* (2006.01)
*H01L 23/525* (2006.01)

(52) U.S. Cl.
CPC .............. *H01L 24/32* (2013.01); *H01L 21/563* (2013.01); *H01L 24/73* (2013.01); *H01L 23/525* (2013.01); *H01L 24/13* (2013.01); *H01L 24/16* (2013.01); *H01L 24/29* (2013.01); *H01L 24/98* (2013.01); *H01L 2224/0401* (2013.01); *H01L 2224/05008* (2013.01); *H01L 2224/05569* (2013.01); *H01L 2224/05572* (2013.01); *H01L 2224/131* (2013.01); *H01L 2224/14131* (2013.01); *H01L 2224/16225* (2013.01); *H01L 2224/16227* (2013.01); *H01L 2224/29011* (2013.01); *H01L 2224/32052* (2013.01); *H01L 2224/32057* (2013.01); *H01L 2224/32225* (2013.01); *H01L 2224/73203* (2013.01); *H01L 2224/73204* (2013.01); *H01L 2224/83104* (2013.01); *H01L 2924/00014* (2013.01)

(58) Field of Classification Search
None
See application file for complete search history.

(56) References Cited

U.S. PATENT DOCUMENTS

| | | | |
|---|---|---|---|
| 6,369,451 | B2 | 4/2002 | Lin |
| 7,187,068 | B2 | 3/2007 | Suh et al. |
| 2004/0012930 | A1 | 1/2004 | Grigg |
| 2004/0118599 | A1 | 6/2004 | Chason et al. |
| 2004/0188131 | A1* | 9/2004 | Dunlap .................... 174/250 |

(Continued)

FOREIGN PATENT DOCUMENTS

| | | |
|---|---|---|
| CN | 101002318 A | 7/2007 |
| CN | 102097397 A | 6/2011 |
| DE | 102005040213 A1 | 3/2006 |
| DE | 112005001949 T5 | 5/2007 |
| KR | 20050084487 | 8/2005 |

(Continued)

*Primary Examiner* — Bilkis Jahan
*Assistant Examiner* — Kevin Quinto
(74) *Attorney, Agent, or Firm* — Slater & Matsil, L.L.P.

(57) ABSTRACT

A package includes a printed circuit board (PCB), and a die bonded to the PCB through solder balls. A re-workable underfill is dispensed in a region between the PCB and the die.

17 Claims, 5 Drawing Sheets

(56) References Cited

U.S. PATENT DOCUMENTS

| | | |
|---|---|---|
| 2004/0251561 A1* | 12/2004 | Wilson et al. .................. 257/788 |
| 2005/0006766 A1 | 1/2005 | Nakayoshi et al. |
| 2005/0080956 A1 | 4/2005 | Zaudtke et al. |
| 2005/0287699 A1* | 12/2005 | Brauer .......................... 438/106 |
| 2008/0044951 A1 | 2/2008 | Bang et al. |
| 2009/0140442 A1 | 6/2009 | Lin |
| 2009/0256268 A1* | 10/2009 | Ayotte et al. .................. 257/778 |
| 2010/0140760 A1 | 6/2010 | Tam et al. |
| 2011/0128711 A1* | 6/2011 | Yim et al. ..................... 361/760 |
| 2011/0157853 A1 | 6/2011 | Goh |
| 2013/0009307 A1 | 1/2013 | Lu et al. |
| 2013/0181338 A1 | 7/2013 | Lu et al. |
| 2014/0054764 A1 | 2/2014 | Lu et al. |
| 2014/0077361 A1 | 3/2014 | Lin et al. |
| 2014/0159223 A1 | 6/2014 | Chen et al. |

FOREIGN PATENT DOCUMENTS

| | | |
|---|---|---|
| KR | 100780956 | 12/2007 |
| KR | 20100131180 A | 12/2010 |

\* cited by examiner

WAFER-LEVEL CHIP SCALE PACKAGE WITH RE-WORKABLE UNDERFILL

BACKGROUND

In the formation of wafer-level chip scale package (WLCSP) structures, integrated circuit devices such as transistors are first formed at the surface of a semiconductor substrate in a wafer. Interconnect structures are then formed over the integrated circuit devices. Solder balls are mounted on the surface of the wafer. The wafer may be sawed into dies.

The dies may be bonded to printed circuit board (PCB) directly. Conventionally, the dies that were directly bonded to PCB were small dies. Accordingly, the stresses applied the solder balls that bond the dies to the respective PCBs were relatively small. Recently, increasingly larger dies need to be bonded to PCBs. The stresses occurring to the solder balls thus became increasingly greater, and the methods for reducing the stresses are needed. However, underfill could not be used in the WLCSP to protect the solder balls. The reason is that if the underfill is applied, the bonding between the dies and the PCBs is not re-workable, and the dies can no longer be removed from the respective PCB in the situations that the dies are defective. As a result, if the underfill is applied, the defective dies cannot be replaced with known good dies once bonded, and the entire PCBs fail.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A wafer-level chip scale package (WLCSP) and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
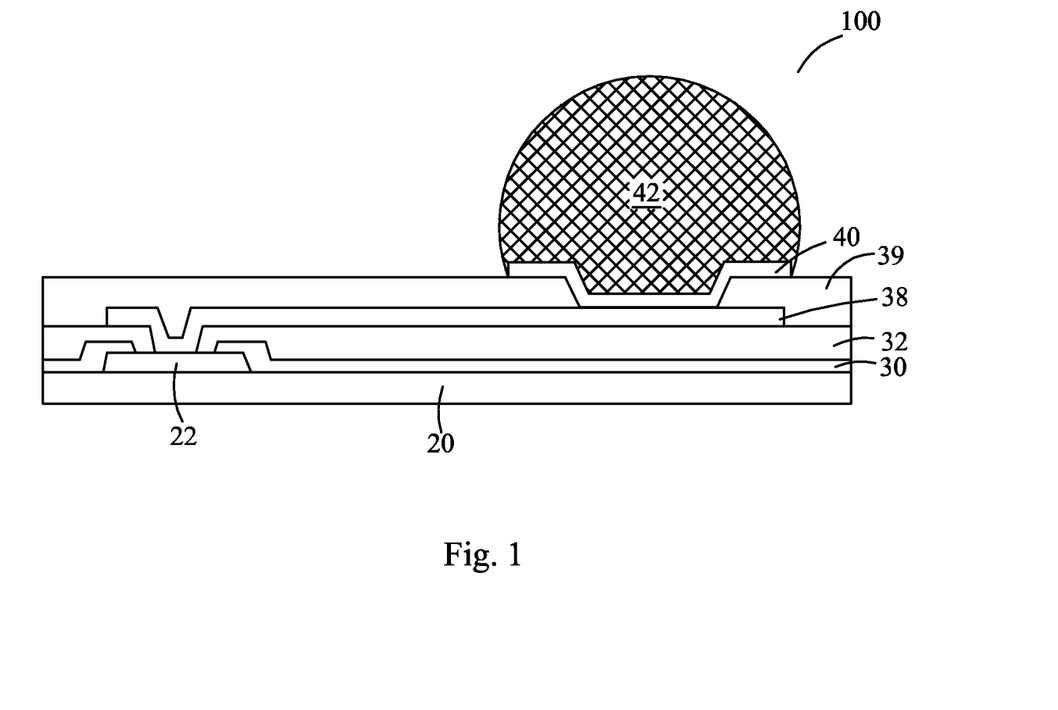
FIG. 1 illustrates a cross-sectional view of a portion of a die to be bonded to a printed circuit board (PCB)

FIG. 1 illustrates exemplary die 100 in accordance with an embodiment. It is appreciated that the die 100 may have structures different from what is shown in FIG. 1. Die 100 may include substrate 20, which may be a semiconductor substrate, such as a silicon substrate, although it may include other semiconductor materials such as silicon germanium, silicon carbon, gallium arsenide, or the like. Active devices such as transistors (not shown) may be formed at the surface of substrate 20. Interconnect structures (not shown), which include metal lines and vias (not shown) formed therein and electrically coupled to the semiconductor devices, is formed over substrate 20.

Metal pad 22 is formed over the interconnect structure. Metal pad 22 may comprise aluminum, copper, silver, gold, nickel, tungsten, alloys thereof, and/or multi-layers thereof. Metal pad 22 may be electrically coupled to the semiconductor devices, for example, through the underlying interconnect structure. Passivation layer 30 and polymer layer 32 may be formed to cover edge portions of metal pad 22. In an exemplary embodiment, passivation layer 30 is formed of dielectric materials such as silicon oxide, silicon nitride, or multi-layers thereof. An opening is formed in passivation layer 30 and polymer layer 32 to expose metal pad 22.

Post-passivation interconnect (PPI) 38 is formed, wherein PPI 38 includes a first portion over polymer layer 32, and a second portion extending into the opening in passivation layer 30 and polymer layer 32. The second portion of PPI 38 is electrically coupled to, and may contact, metal pad 22. Polymer layer 39 may be formed over PPI 38. Under bump metallurgy (UBM) 40 is formed to extend into an opening in polymer layer 39, wherein UBM 40 is electrically coupled to PPI 38, and may contact a pad in PPI 38. Solder ball 42 is placed over UBM 40 and reflowed. Die 100 may include a plurality of solder balls 42.

Figure 2A:
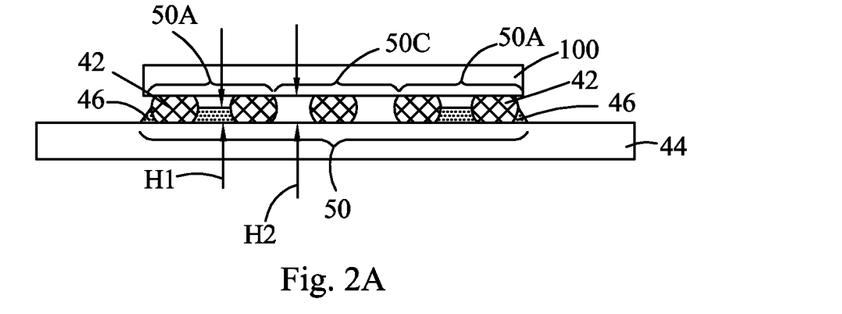
FIGS. 2A and 2B illustrate a cross-sectional view and a top view, respectively, of a wafer-level chip scale package (WLCSP) structure in accordance with an embodiment, wherein an underfill is filled into corner regions between a die and a PCB, and wherein the underfill contacts one of the die and the PCB.
Figure 2B:
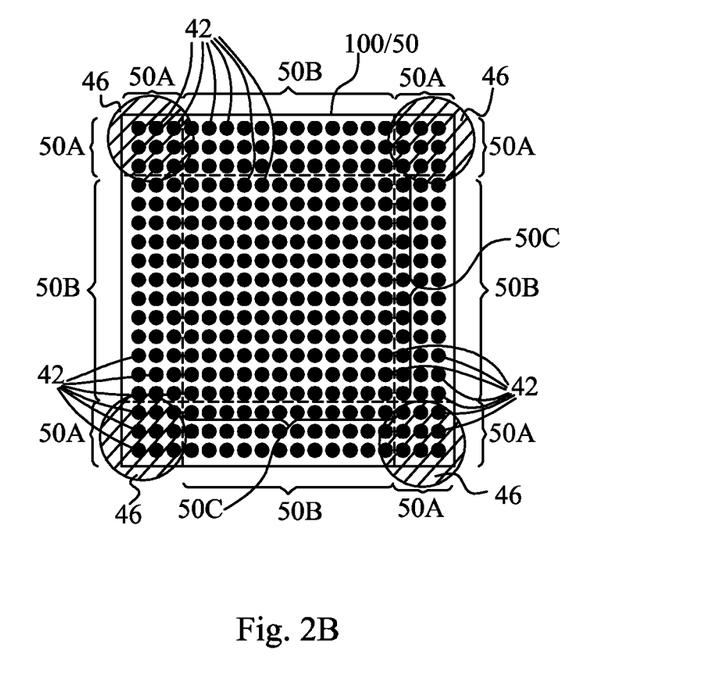

FIGS. 2A and 2B illustrate a cross-sectional view and a top view, respectively, of a WLCSP structure in accordance with an embodiment. Referring to FIG. 2A. The WLCSP package includes die 100 bonded to printed circuit board (PCB) 44 through solder balls 42. Solders balls 42 are accordingly in physical contact with die 100 and PCB 44. Underfill 46 is dispensed into region 50, which the region between die 100 and PCB 44.

FIG. 2B illustrates a top view of a portion the WLCSP structure in FIG. 1, wherein solder balls 42, region 50, and die 100 are illustrated. Solder balls 42 may be distributed throughout region 50 that is between die 100 and PCB 44, wherein each of the circles represents one of the solder balls 42. In an exemplary embodiment, solder balls 42 are distributed as an array having a rectangular shape. Region 50 may be divided into corner regions 50A, edge regions 50B that interconnect neighboring regions 50A, and center region 50C. Corner regions 50A, edge regions 50B, and center region 50C are adjacent to the corners, the edges, and the center, respectively, of die 100. Corner regions 50A and edge regions 50B in combination encircle center region 50C in the top view of the WLCSP structure. In an embodiment, in each of corner regions 50A, edge regions 50B, and center region 50C, there is at least one, and possibly more, solder balls 42. For example, each of corner regions 50A, edge regions 50B, and center region 50C may include 2×2 (two rows by two columns), 3×3 (three rows by three columns), or even more, solder balls 42.

As also shown in FIG. 2B, underfill 46 may be dispensed into selected regions 50A/50B/50C of region 50, while remaining regions 50A/50B/50C of region 50 are not dispensed with underfill 46. In an embodiment, in the regions not dispensed with underfill 46, air is filled, and solder balls 42 may be surrounded by air-gaps in the top view of the WLCSP structure. Accordingly, solder balls 42 that are in the selected regions 50A/50B/50C are in physical contact, and may be protected by, underfill 46, while the solder balls 42 in the remaining regions 50A/50B/50C are not protected by underfill 46. In an exemplary embodiment, underfill 46 is dispensed into corner regions 50A, while edge regions 50B and center region 50C are not dispensed with underfill 46. Since the distances to neutral point (DNP) of stresses are greatest at corner regions 46A, solder balls 42 that are in corner regions 50A may suffer from stresses higher than solder balls 42 in center region 50C and edge regions 50B. As a result, dispensing underfill 46 into corner regions 50C has a good effect in protecting solder balls 42. On the other hand, edge regions 50B and center region 50C suffer from relatively smaller stresses, and hence may not have underfill 46 dispensed therein. In an embodiment, underfill 46 is dispensed to contact 2×2 or 3×3 corner solder balls 42 in corner regions 50A, although underfill 46 may also contact one corner solder ball 42 or more than 3×3 corner solder balls (such as 4×4 corner solder balls, 5×5 corner solder balls, or the like). In an embodiment, as shown in FIG. 2B, the four corner regions 50A are dispensed with underfill 46. In alternative embodiments, underfill 46 may be dispensed to one, two, or three corner regions 50A, while the remaining corner regions 50A are not dispensed with underfill 46.

Referring to FIG. 2A again, in an embodiment, underfill 46 has height H1 smaller than standoff distance H2 between die 100 and PCB 44. Height H1 is measured where underfill 46 (in the respective region) is the thickest. Underfill 46 physically contacts PCB 44, and is not in physically contact with die 100. For example, height H1 may be between about 25 percent and about 75 percent of standoff distance H2. Alternatively stating, in the illustrated exemplary embodiment, the portions of corner regions 50A that are close to PCB 44 are filled with underfill 46, while the portions of corner regions 50A close to die 100 are not filled with underfill 46. In alternative embodiments, underfill 46 is dispensed to the portions of corner regions 50A close to die 100, and not dispensed to the portions of corner regions 50A close to PCB 44. Accordingly, underfill 46 may be in physical contact with die 100, and is not in physical contact with PCB 44.

Figure 5:
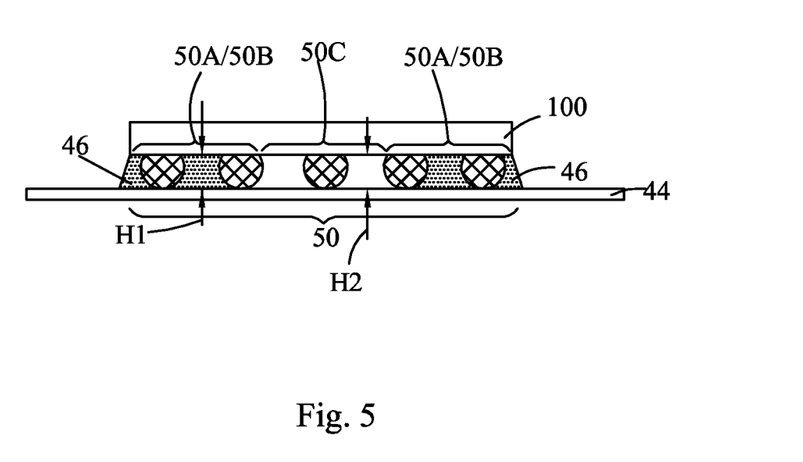
FIG. 5 illustrates a cross-sectional view of a WLCSP structure in accordance with alternative embodiments, wherein an underfill is filled into the corner regions and the edge regions between a die and a PCB, and wherein the underfill contacts both the die and the PCB.

Throughout the description, underfill 46 in accordance with embodiments may be a re-workable underfill, which can be removed relatively easily after being cured. Accordingly, if die 100 is found to be defective after being bonded to PCB 44, underfill 46 may be removed, for example, using a solvent, so that die 100 may be replaced with another die. In an embodiment, re-workable underfill 46 throughout the description has a molecular weight ranging between 30,000 and about 300,000. As a comparison, un-re-workable underfills may have molecular weights greater than about 500,000, and may not be removed using solvents without damaging the respective package. In the embodiments, by dispensing re-workable underfill 46 to peripheral regions such as corner regions 50A, edge regions 50B (as shown in FIG. 5B), and the like, with no underfill 46 dispensed into center region 50C, it is easy to remove underfill 46 and to remove a defective die 100.

Figure 3:
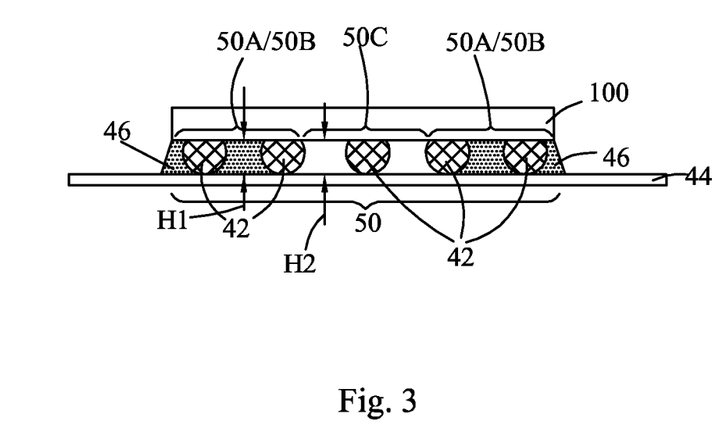
FIG. 3 illustrates a cross-sectional view of a WLCSP structure in accordance with alternative embodiments, wherein an underfill is filled into the corner regions between a die and a PCB, and wherein the underfill contacts both the die and the PCB.

FIG. 3 illustrates a cross-sectional of a WLCSP structure in accordance with alternative embodiments. The top view of the WLCSP structure as shown in FIG. 3 may also be represented using FIG. 2B. Unless specified otherwise, the reference numerals in these embodiments and subsequently discussed alternative embodiments represent like elements in the embodiments illustrated in FIGS. 1 through 2B. The embodiments as shown in FIG. 3 are similar to the embodiments as shown in FIGS. 2A and 2B, except that underfill 46 is in physical contact with both die 100 and PCB 44. Accordingly, height H1 of underfill 46 is equal to standoff distance H2.

Figure 4A:
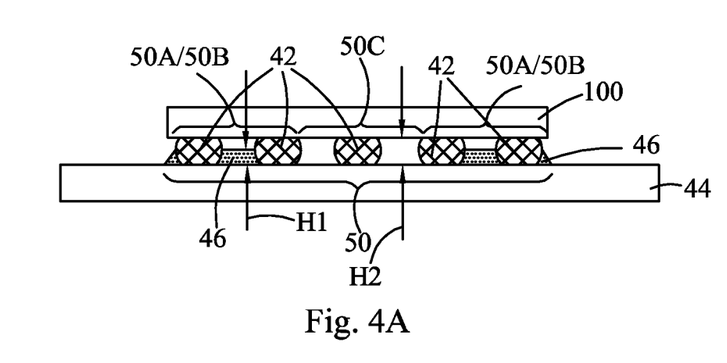
FIGS. 4A and 4B illustrate a cross-sectional view and a top view, respectively, of a WLCSP structure in accordance with alternative embodiments, wherein an underfill is filled into corner regions and edge regions between a die and a PCB, and wherein the underfill contacts one of the die and the PCB.
Figure 4B:
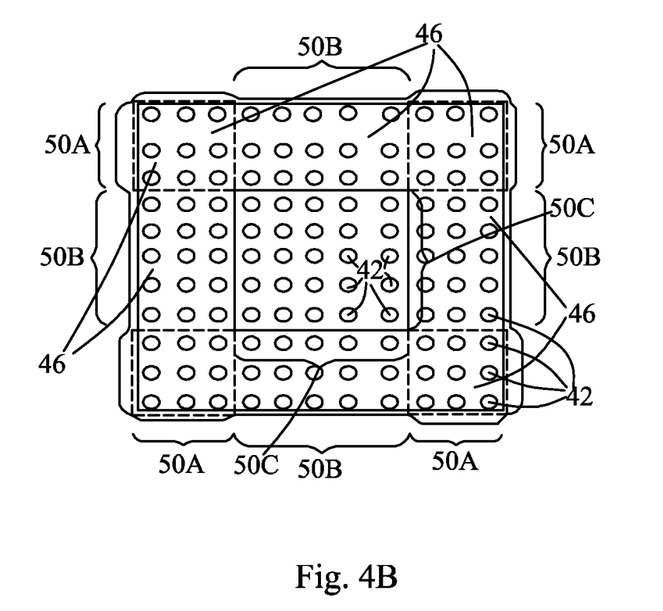

FIGS. 4A and 4B illustrate a cross-sectional view and a top view, respectively, of a WLCSP structure in accordance with alternative embodiments. Referring to FIG. 4A, underfill 46 is dispensed into corner regions 50A and edge regions 50B, and is not dispensed into center region 50C. FIG. 4B illustrates a top view. In an embodiment, underfill 46 is dispensed into at least one corner region 50A and one edge region 50B, wherein the portions of underfill 46 in corner region 50A and in edge region 50B may be interconnected one combined underfill region. In further embodiments, underfill 46 is dispensed into more than one corner region 50A and/or more than one edge region 50B. However, underfill 46 is not connected to form a loop (in the top view) encircling center region 50C, which center region 50C is not filled with underfill 46. In yet other embodiments, as shown in FIG. 4B, underfill 46 that is dispensed into all corner regions 50A and all edge regions 50B is interconnected to form a loop (in the top view) encircling center region 50C. Center region 50C, however, is not dispensed with underfill 46. In corner regions 50A and/or edge regions 50B, one row, two rows, three rows, four rows, and the like, of solder balls 42 may be in contact with underfill 46, while inner rows of underfill 46 may not be in contact with underfill 46.

As shown in FIG. 4A, underfill 46 has height H1 smaller than standoff distance H2 between die 100 and PCB 44. Accordingly, underfill 46 physically contacts PCB 44, and is not in physical contact with die 100. In alternative embodiments, underfill 46 physically contacts die 100, and is not in physical contact with PCB 44.

FIG. 5 illustrates a cross-sectional of a WLCSP structure in accordance with alternative embodiments. The top view of the WLCSP structure as shown in FIG. 5 may also be represented by FIG. 4B. The embodiments as shown in FIG. 5 is similar to the embodiments as shown in FIGS. 4A and 4B, except that underfill 46 is in physical contact with both die 100 and PCB 44. Accordingly, height H1 of underfill 46 is equal to standoff distance H2.

Figure 6A:
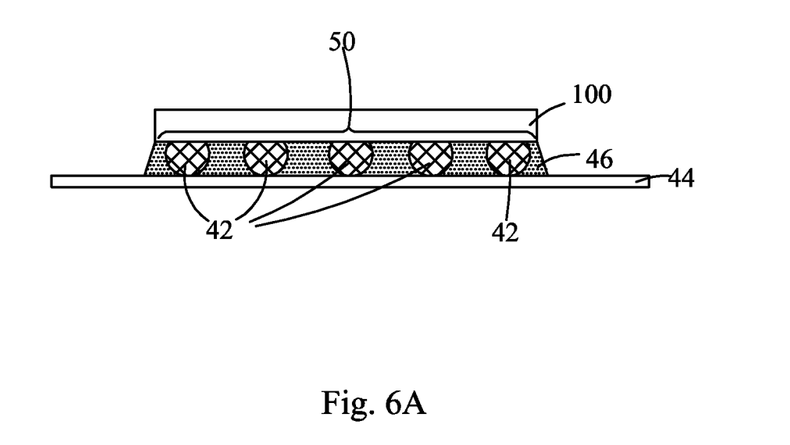
FIGS. 6A and 6B illustrate a cross-sectional view and a top view, respectively, of a WLCSP structure in accordance with alternative embodiments, wherein a re-workable underfill that can be removed easily is filled into the corner regions, the edge regions, and the center region between a die and a PCB.
Figure 6B:
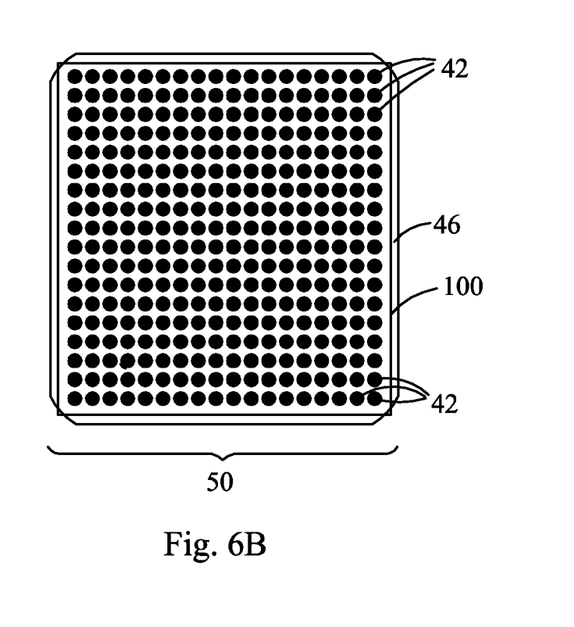

FIGS. 6A and 6B illustrate a cross-sectional view and a top view, respectively, of a WLCSP structure in accordance with yet other embodiments. Referring to FIG. 6A, the WLCSP package includes die 100 bonded to PCB 44 through solder balls 42. Underfill 46 is dispensed into substantially an entirety of region 50 between die 100 and PCB 44. FIG. 6B illustrates a top view, which illustrates that underfill 46 is filled into the entirety of region 50 include corner regions, edge regions and the center region. Underfill 46 is a re-workable underfill, and hence is removable in the case die 100 is defective, and needs to be replaced with another die.

By applying an underfill to protect the solder balls that suffer from high stresses, while the solder balls that suffer from low stresses are not protected by the underfill, the underfill can be removed easily without damaging the respective PCB and the devices bonded thereon. Using the re-workable underfill also makes the removal of underfill possible. Accordingly, the defected WLCSP structure may be re-worked to replace defect dies with known good dies.

Although less underfill is dispensed, the since the solder balls that are most likely to fail under stresses are protected, the lifetime of the respective WLCSP is increased. Simulation results have indicated that compared to the stresses in a WLCSP not filled with any underfill, in a WSCSP with the entire region between the respective die and the PCB filled with an underfill, the stresses in corner solder balls are reduced by about 52 percent. If 3×3 solder balls in four corner regions are protected by the underfill, with no underfill dispensed into edge regions and the center region, the stress is reduced by about 49 percent. Therefore, even if the underfill is dispensed into selected regions, and not into the center region, the protection provided to the highly-stressed solder balls is close to the protection provided by the underfill that is dispensed to all of the spacing between PCB 44 and die 100.

In accordance with embodiments, a package includes a PCB, and a die bonded to the PCB through solder balls. A re-workable underfill is dispensed in a region between the PCB and the die.

In accordance with other embodiments, a package includes a PCB and a die. The region between the PCB and the die includes a center region adjacent to a center of the die, corner regions adjacent to corners of the die, and edge regions adjacent to edges of the die. The corner regions and the edge regions surround the center region. Each of the edge regions interconnects two of the corner regions. Solder balls bond the PCB to the die. Each of the center region, the edge regions, and the corner regions includes at least one of the solder balls therein. An underfill is dispensed into one of the corner regions, and is not dispensed into the center region.

In accordance with yet other embodiments, a package includes a PCB and a die. The region between the PCB and the die includes a center region, corner regions, and edge regions, with the corner regions and the edge regions surrounding the center region. Each of the edge regions interconnects two of the corner regions. Solder balls bond the PCB to the die. Each of the center region, the edge regions, and the corner regions includes at least one of the solder balls therein. An underfill is dispensed into the corner regions to form discrete underfill regions that are separated from each other. The underfill contacts the solder balls that are in the corner regions, wherein no underfill is filled into the center region. The underfill is in contact with the PCB, and is not in physical contact with the die.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a printed circuit board (PCB);
   a die bonded to the PCB through solder balls; and
   a re-workable underfill dispensed in a region between the PCB and the die, wherein there is a gap between the underfill and at least one of the PCB and the die, wherein the gap has a height from about 75 percent to about 25 percent of a standoff distance between the PCB and the die, and wherein the height is measured in a direction perpendicular to a major surface of the PCB.

2. The package of claim 1, wherein the re-workable underfill has a molecular weight ranging between 30,000 and about 300,000.

3. The package of claim 1, wherein the underfill is in physical contact with the PCB, and is not in physical contact with the die.

4. The package of claim 1, wherein the underfill is in physical contact with the die, and is not in physical contact with the PCB.

5. The package of claim 1, wherein the region between the PCB and the die comprises a center region, corner regions, and edge regions, with the corner regions and the edge regions surrounding the center region, and wherein the underfill is in one of the corner regions, and is not in the center region.

6. The package of claim 5, wherein the underfill filled into two neighboring corner regions form two underfill regions separated from each other, with no underfill interconnecting the two underfill regions.

7. The package of claim 6, wherein the underfill is further in one of the edge regions connecting the two underfill regions.

8. A package comprising:
   a printed circuit board (PCB);
   a die, wherein the region between the PCB and the die comprises:
     a center region adjacent to a center of the die;
     corner regions adjacent to corners of the die; and
     edge regions adjacent to edges of the die, wherein the corner regions and the edge regions surround the center region, and wherein each of the edge regions interconnects two of the corner regions;
   solder balls bonding the PCB to the die, wherein each of the center region, the edge regions, and the corner regions comprises at least one of the solder balls therein; and
   an underfill dispensed into one of the corner regions, wherein the underfill is not dispensed into the center region, wherein a height of the underfill is between about 25 percent and about 75 percent a standoff distance between the PCB and the die, and wherein the height is measured in a direction perpendicular to a major surface of the PCB.

9. The package of claim 8, wherein the one of the corner regions comprises at least 3×3 solder balls therein, with the at least 3×3 solder balls being in contact with the underfill.

10. The package of claim 8, wherein the region between the PCB and the die comprises four corner regions, wherein the underfill is dispensed into the four corner regions, and wherein at least one of the edge regions is free from the underfill.

11. The package of claim 8, wherein the underfill is dispensed into four corner regions and four edge regions.

12. The package of claim 11, wherein the underfill dispensed into the four corner regions and the four edge regions forms a full loop encircling the center region in a top view of the package.

13. A package comprising:
- a printed circuit board (PCB);
- a die, wherein the region between the PCB and the die comprises:
  - a center region;
  - corner regions; and
  - edge regions, with the corner regions and the edge regions surrounding the center region, wherein each of the edge regions interconnects two of the corner regions;
- solder balls bonding the PCB to the die, wherein each of the center region, the edge regions, and the corner regions comprises at least one of the solder balls therein; and
- an underfill dispensed into the corner regions to form discrete underfill regions separated from each other, wherein the underfill contacts the solder balls that are in the corner regions, wherein no underfill is filled into the center region, and wherein the underfill is in contact with the PCB, and is not in physical contact with the die, wherein a height of the underfill is between about 25 percent and about 75 percent a standoff distance between the PCB and the die, and wherein the height is measured in a direction perpendicular to a major surface of the PCB.

14. The package of claim 13, wherein portions of the solder balls in the center region are surrounded by air-gaps in a top view of the package.

15. The package of claim 13, wherein the solder balls in at least one of the edge regions is not in physical contact with the underfill.

16. The package of claim 13, wherein portions of the solder balls in the edge regions are surrounded by air-gaps in a top view of the package.

17. The package of claim 13, wherein in one of the corner regions, the underfill surrounds, and is in contact with, at least three rows by three columns of the solder balls.

* * * * *